United States Patent
Nam et al.

(10) Patent No.: US 9,245,718 B2
(45) Date of Patent: Jan. 26, 2016

(54) SHOWERHEAD ELECTRODE ASSEMBLY IN A CAPACITIVELY COUPLED PLASMA PROCESSING APPARATUS

(71) Applicant: Lam Research Corporation, Fremont, CA (US)

(72) Inventors: Sang Ki Nam, Danville, CA (US); Rajinder Dhindsa, San Jose, CA (US); Ryan Bise, Los Gatos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/662,702

(22) Filed: Mar. 19, 2015

(65) Prior Publication Data

US 2015/0194291 A1 Jul. 9, 2015

Related U.S. Application Data

(63) Continuation of application No. 13/625,555, filed on Sep. 24, 2012, now Pat. No. 9,018,022.

(51) Int. Cl.
*H01L 21/00* (2006.01)
*H01J 37/32* (2006.01)
*H01L 21/3065* (2006.01)
*H01L 21/66* (2006.01)
*C23C 16/455* (2006.01)

(52) U.S. Cl.
CPC ....... *H01J 37/3244* (2013.01); *H01J 37/32091* (2013.01); *H01J 37/32449* (2013.01); *H01J 37/32532* (2013.01); *H01L 21/3065* (2013.01); *H01L 22/26* (2013.01); *C23C 16/45565* (2013.01)

(58) Field of Classification Search
None
See application file for complete search history.

(56) References Cited

U.S. PATENT DOCUMENTS

| | | | |
|---|---|---|---|
| 6,090,304 A | 7/2000 | Zhu et al. | |
| 6,483,690 B1 | 11/2002 | Nakajima et al. | |
| 6,740,853 B1 | 5/2004 | Johnson et al. | |
| 6,824,627 B2 | 11/2004 | Dhindsa et al. | |
| 6,847,014 B1 | 1/2005 | Benjamin et al. | |
| 6,949,722 B2 | 9/2005 | Strang et al. | |
| 7,033,444 B1 | 4/2006 | Komino et al. | |
| 7,156,951 B1 | 1/2007 | Gao et al. | |
| 7,161,121 B1 | 1/2007 | Steger | |
| 7,173,219 B2 | 2/2007 | Okajima et al. | |
| 7,645,341 B2 | 1/2010 | Kennedy et al. | |
| 7,671,412 B2 | 3/2010 | Carcasi et al. | |
| 7,718,932 B2 | 5/2010 | Steger | |
| 7,939,784 B2 | 5/2011 | Steger et al. | |
| 7,972,444 B2 | 7/2011 | Zucker et al. | |
| 8,038,855 B2 | 10/2011 | Sandoval et al. | |
| 8,069,817 B2 | 12/2011 | Fischer et al. | |
| 8,083,855 B2 | 12/2011 | Dhindsa et al. | |
| 8,317,968 B2 | 11/2012 | Dhindsa et al. | |
| 8,361,271 B2 | 1/2013 | Aihara et al. | |
| 8,597,463 B2 | 12/2013 | Sasaki | |
| 9,018,022 B2 | 4/2015 | Nam et al. | |
| 2010/0078151 A1 | 4/2010 | Koenigsberg et al. | |
| 2010/0116788 A1 | 5/2010 | Singh et al. | |
| 2010/0122774 A1 | 5/2010 | Makabe et al. | |

*Primary Examiner* — Angel Roman
(74) *Attorney, Agent, or Firm* — Buchanan, Ingersoll & Rooney PC

(57) ABSTRACT

A showerhead electrode assembly for use in a capacitively coupled plasma processing apparatus comprising a heat transfer plate. The heat transfer plate having independently controllable gas volumes which may be pressurized to locally control thermal conductance between a heater member and a cooling member such that uniform temperatures may be established on a plasma exposed surface of the showerhead electrode assembly.

20 Claims, 4 Drawing Sheets

Figure 1:
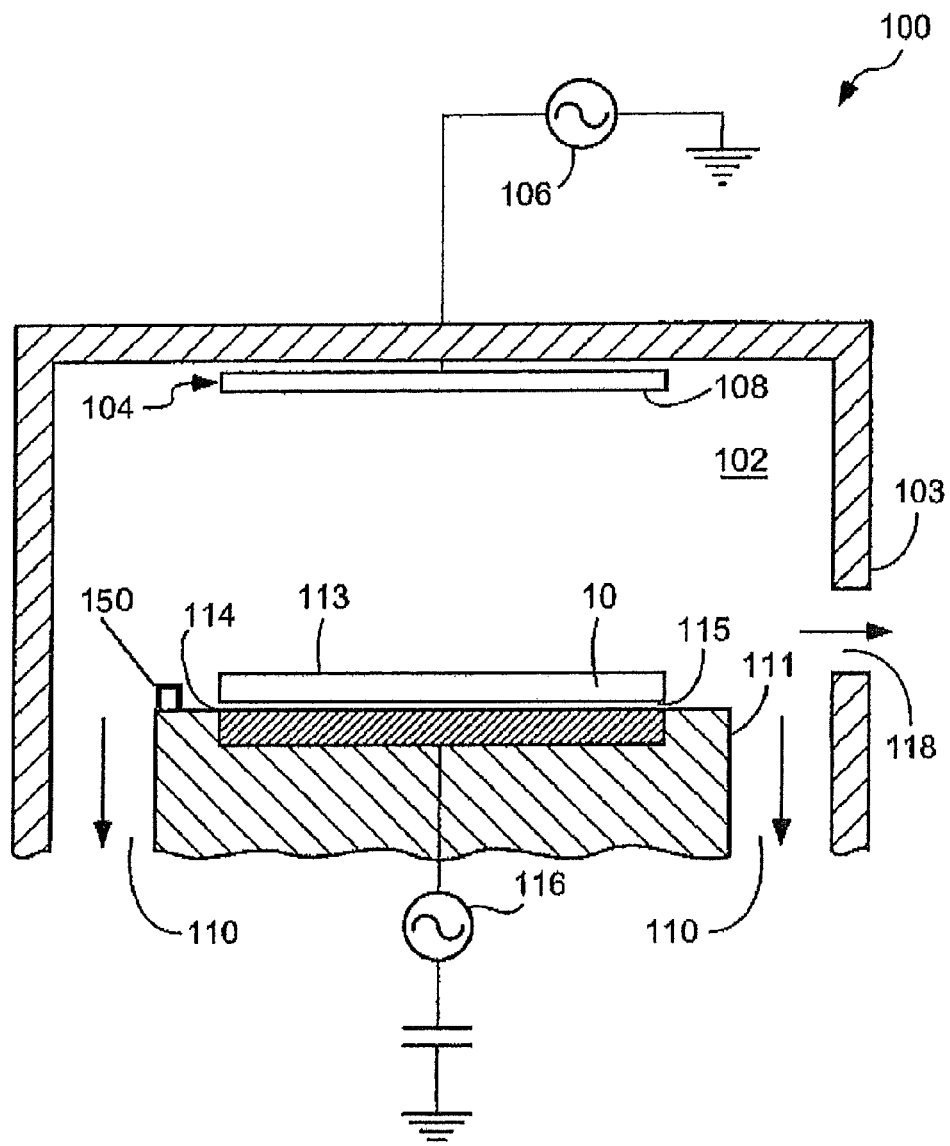

SHOWERHEAD ELECTRODE ASSEMBLY IN A CAPACITIVELY COUPLED PLASMA PROCESSING APPARATUS

CROSS-REFERENCE TO RELATED APPLICATION

This application is a continuation of U.S. patent application Ser. No. 13/625,555, filed Sep. 24, 2012 for SHOWERHEAD ELECTRODE ASSEMBLY IN A CAPACITIVELY COUPLED PLASMA PROCESSING APPARATUS, the entire content of which is hereby incorporated by reference.

FIELD OF THE INVENTION

The invention relates to plasma processing apparatuses wherein a heat transfer plate is used to control temperature uniformity of a showerhead electrode assembly supported in a capacitively coupled plasma processing apparatus.

BACKGROUND

Semiconductor substrate ("substrate") fabrication often includes exposing a substrate to a plasma to allow the reactive constituents of the plasma to modify the surface of the substrate, e.g., remove material from unprotected areas of the substrate surface. The substrate characteristics resulting from the plasma fabrication process are dependent on the process conditions, including the plasma characteristics and substrate temperature. For example, in some plasma processes a critical dimension, i.e., feature width, on the substrate surface can vary by about one nanometer per ° C. of substrate temperature. It should be appreciated that differences in substrate temperature between otherwise identical substrate fabrication processes will result in different substrate surface characteristics. Thus, a drift in process results between different substrates can be caused by variations in substrate temperature during plasma processing. Additionally, center-to-edge substrate temperature variations can adversely affect a die yield per substrate.

A general objective in substrate fabrication is to optimize a die yield per substrate and fabricate each substrate of a common type in as identical a manner as possible. To meet these objectives, it is necessary to control fabrication parameters that influence the plasma processing characteristics across an individual substrate and among various substrates of a common type. Because plasma constituent reactivity is proportional to temperature, substrate temperature and plasma exposed surface temperatures can have a strong influence on plasma processing results across the substrate and among various substrates. Therefore, a continuing need exists for improvements in temperature control during plasma fabrication processes.

SUMMARY

Disclosed herein is a showerhead electrode assembly of a plasma processing chamber, comprising a showerhead electrode, a temperature controlled top plate configured to support the showerhead electrode, a heater plate disposed between the temperature controlled top plate and the showerhead electrode, and a heat transfer plate. The heat transfer plate is disposed between the showerhead electrode and the temperature controlled top plate, wherein the heat transfer plate comprises a plurality of independently controllable gas volumes defined to be fluidly isolated from others of the plurality of independently controllable gas volumes, such that a gas pressure within any given one of the plurality of independently controllable gas volumes does not affect another gas pressure within any other of the plurality of independently controllable gas volumes.

Additionally disclosed herein is a capacitively coupled plasma processing apparatus comprising a vacuum chamber, a lower electrode assembly adapted to receive a semiconductor substrate, and the showerhead electrode assembly described above. At least one vacuum port is disposed in a bottom wall of the vacuum chamber and is connected to at least one vacuum pump operable to maintain the vacuum chamber at a predetermined vacuum pressure. A gas source supplies process gas through the showerhead electrode assembly to the vacuum chamber and an RF energy source is configured to energize the process gas into a plasma state.

Further disclosed herein is a method of processing a semiconductor substrate in a capacitively coupled plasma processing apparatus. The method comprises placing a semiconductor substrate on a top surface of a lower electrode assembly inside the vacuum chamber. Each independently controllable gas volume in the heat transfer plate is maintained at a predetermined pressure to effect a desired temperature distribution across the plasma exposed surface of the showerhead electrode. Temperatures across the plasma exposed surface of the showerhead electrode are determined and pressure in each independently controllable gas volume is adjusted to compensate for temperature gradients along the plasma exposed surface of the showerhead electrode. Process gas is supplied into the vacuum chamber from a gas supply, the gas is energized into a plasma state, and the semiconductor substrate is then etched with the plasma.

BRIEF DESCRIPTION OF THE DRAWING FIGURES

FIG. 1 depicts an exemplary plasma processing apparatus that may be used in accordance with preferred embodiments of the electrode assemblies described herein.

Figure 2A:
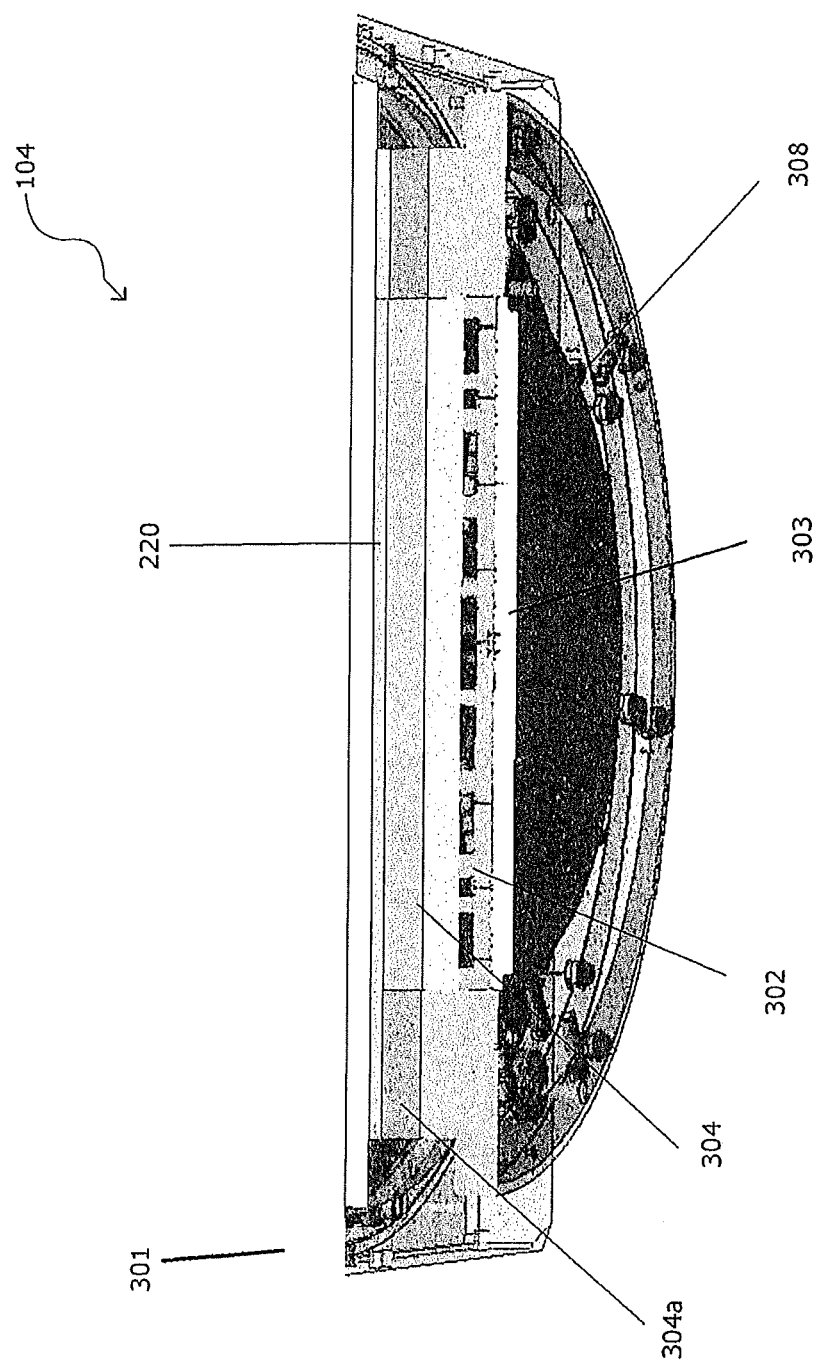

FIG. 2A, B illustrate cross sections of preferred embodiments of a showerhead electrode assembly.

Figure 3A:
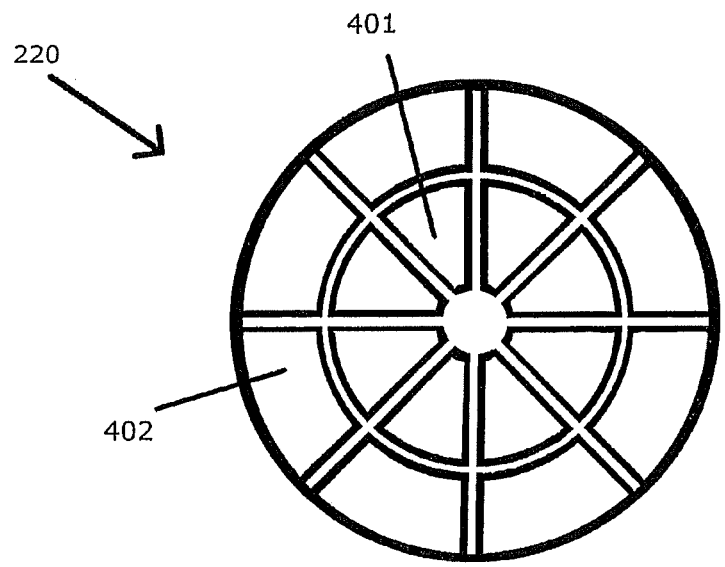

FIG. 3A, B illustrate exemplary embodiments of a heat transfer plate.

DETAILED DESCRIPTION

Disclosed herein is a showerhead electrode assembly of a capacitively coupled plasma processing apparatus which will now be described in detail with reference to a few preferred embodiments thereof as illustrated in the accompanying drawings. In the following description, numerous specific details are set forth in order to provide a thorough understanding of the present embodiments. It will be apparent, however, to one skilled in the art, that the present embodiments may be practiced without some or all of these specific details. In other instances, well known process steps and/or structures have not been described in detail in order to not unnecessarily obscure the present embodiments. As used herein, the term "about" should be construed to include values up to 10% above or below the values recited.

FIG. 1 depicts an exemplary plasma processing apparatus 100 that can be used to practice preferred embodiments of the assemblies described herein. The plasma processing apparatus is a capacitively coupled plasma processing vacuum chamber, which can generate a plasma. The plasma processing apparatus 100 comprises a vacuum chamber 102 which includes a chamber wall 103. The inner surface of the chamber wall 103 is preferably anodized aluminum and/or has a coating of plasma resistant material such as a thermally sprayed yttria coating. The vacuum chamber 102 includes a substrate transfer slot 118 provided in the chamber wall 103 to transfer semiconductor substrates into and out of the vacuum chamber 102.

The vacuum chamber 102 can include a showerhead electrode assembly 104 having a plasma exposed surface 108. The showerhead electrode assembly 104 can have a single-piece electrode or a multi-piece electrode. For example, the showerhead electrode assembly 104 can have a single-piece construction including a showerhead electrode plate, or it can include a showerhead electrode plate and an outer electrode ring. In such later embodiments, both the showerhead electrode plate and the outer electrode ring can be optionally backed by a plate of graphite or metal such as aluminum bonded thereto by a bonding material, such as an elastomer material, or fastened together with suitable fasteners. The showerhead electrode assembly 104 can be sized to process 200 mm semiconductor substrates, 300 mm substrates, or even larger substrates for example. The showerhead electrode plate of the showerhead electrode assembly 104 (including the outer electrode ring in multi-piece constructions) can be of silicon (e.g., single crystalline silicon, polycrystalline silicon or amorphous silicon) or silicon carbide. The apparatus 100 includes a gas source (not shown) for supplying process gas to the showerhead electrode assembly 104. The showerhead electrode assembly 104 is preferably powered by an RF supply 106 via a matching network. In another embodiment, the showerhead electrode plate of the showerhead electrode assembly 104 can be grounded to provide a return path for power supplied by a bottom electrode comprised in a substrate support 111 of the vacuum chamber 102, as described below.

In the embodiment of the apparatus 100 shown in FIG. 1, process gas is supplied into the vacuum chamber 102 at the plasma region developed between the showerhead electrode assembly 104 and a semiconductor substrate 10 supported on the substrate support 111. The substrate support 111 preferably includes an electrostatic chuck 114 ("ESC") that secures the semiconductor substrate 10 on the substrate support 111 by an electrostatic clamping force. In an embodiment, the ESC 114 may act as a bottom electrode and is preferably biased by an RF power source 116 (typically via a matching network). The upper surface 115 of the ESC 114 preferably has approximately the same diameter as the semiconductor substrate 10.

In an embodiment the ESC 114 may further include an embedded temperature control module comprising a plurality of channels (not shown) to provide heating/cooling zones. An exemplary temperature control module that can be used may be found in commonly owned U.S. Pat. No. 8,083,855, which is hereby incorporated by reference in its entirety.

The substrate support 111 may further include at least one temperature sensor 150 for measuring temperatures across a plasma exposed surface 108 of the showerhead electrode assembly 104. The temperature sensor 150 may be a laser interferometer or other suitable sensor, and is preferably connected to a controller for processing temperature measurements taken by said sensor. In alternate embodiments the temperature sensor 150 may be incorporated in the showerhead electrode assembly 104.

The vacuum chamber 102 may comprise at least one vacuum port (not shown) connected to at least one vacuum pump (not shown). The vacuum pump is adapted to maintain a predetermined vacuum pressure inside the vacuum chamber 102. Process gas and reaction by-products are drawn by the pump generally in the direction represented by arrows 110.

An exemplary capacitively coupled plasma reactor that can be used is a dual-frequency plasma etch reactor (see, e.g., commonly-assigned U.S. Pat. No. 6,090,304, which is hereby incorporated by reference in its entirety). In such reactors, etching gas can be supplied to the showerhead electrode from a gas supply and a plasma can be generated in the reactor by supplying RF energy from two RF sources to the showerhead electrode and/or a bottom electrode, or the showerhead electrode can be electrically grounded and RF energy at two different frequencies can be supplied to the bottom electrode.

FIG. 2A illustrates a cross section of an embodiment of the showerhead electrode assembly 104 to be used in a capacitively coupled plasma chamber comprising a showerhead electrode 303 and an optional backing member 302 secured to the showerhead electrode 303, a heater plate 304, and a temperature controlled top plate 301. The heater plate 304 can have an optional outer heater member 304a. The showerhead electrode 303 is positioned above a substrate support 111 (see FIG. 1) supporting a semiconductor substrate 10.

The temperature controlled top plate 301 can form a removable top wall of the plasma processing apparatus. The showerhead electrode 303 can include an inner electrode member, and an optional outer electrode member (not shown). The inner electrode member is typically made of single crystal silicon. If desired, the inner and outer electrodes can be made of a single piece of material such as CVD silicon carbide, single crystal silicon or other suitable material.

The inner electrode member can have a diameter smaller than, equal to, or larger than a semiconductor substrate to be processed, e.g., up to 200 mm. For processing larger semiconductor substrates such as 300 mm substrates or larger, the outer electrode member is adapted to expand the diameter of the showerhead electrode 303. The outer electrode member can be a continuous member (e.g., a poly-silicon or silicon carbide member, such as a ring), or a segmented member (e.g., 2-6 separate segments arranged in a ring configuration, such as segments of single crystal silicon). Alternatively, the showerhead can be a monolithic part.

The showerhead electrode 303 preferably includes multiple gas passages for injecting a process gas into a space in the vacuum chamber 102 below the showerhead electrode 303. The outer electrode preferably may form a raised step at the periphery of the showerhead electrode 303. Further details of a stepped electrode can be found in commonly-owned U.S. Pat. No. 6,824,627, the disclosure of which is hereby incorporated by reference.

Figure 2B:
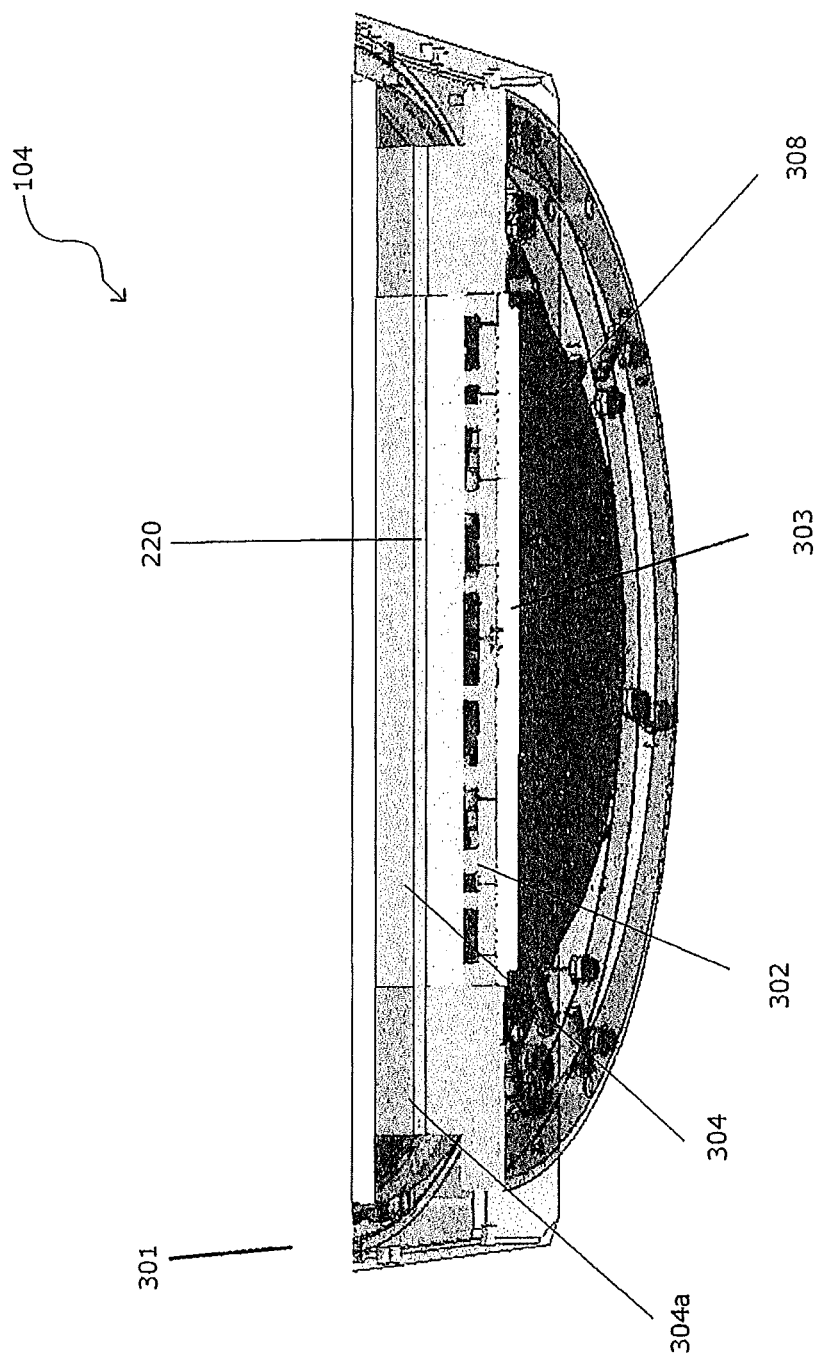

In an embodiment the showerhead electrode assembly 104 includes a heat transfer plate 220 for controlling heat transfer in the showerhead electrode assembly 104. The heat transfer plate 220 is disposed between the heater plate 304 and the temperature controlled top plate 301 and is adapted to contain a heat transfer gas which can be pressurized to increase thermal conductance between the heater plate 304 and the temperature controlled top plate 301. In an alternate embodiment, as illustrated in FIG. 2B, the heat transfer plate 220 may be disposed between the heater plate 304 and the showerhead electrode 303. The heat transfer plate 220 comprises a plurality of gas volumes wherein each gas volume is independently controllable such that a gas pressure within any given gas volume does not affect another gas pressure within any other of the plurality of independently controlled gas volumes.

When the independently controllable gas volumes in the heat transfer plate 220 undergo an increase in gas pressure, thermal coupling between elements adjacent to the heat transfer plate 220, such as for example, the temperature controlled top plate and the heater plate, increases as well. The increase in thermal coupling may be utilized to quickly heat the showerhead electrode assembly 104 to prepare for semiconductor substrate processing, or may be used to compensate for thermal gradients across the plasma exposed surface of the showerhead electrode assembly 104 and provide more uniform etch results. Additionally, gas may be evacuated from the independently controllable gas volumes of the heat transfer plate 220, wherein the heat transfer plate 220 will act as an insulator, and temperatures in the showerhead electrode assembly 104 may be maintained.

The plurality of independently controllable gas volumes can hold a pressurized heat transfer gas, for example, helium, neon, argon, nitrogen, or a mixture thereof. Preferably, the heat transfer gas used is helium. Gas conduits (not shown) are provided within the temperature controlled top plate 301 to be in fluid communication with each of the independently controllable gas volumes. During the plasma process, the heat transfer gas can be supplied or exhausted via the gas conduits, to achieve a specified gas pressure within the plurality of independently controllable gas volumes.

The gas volumes are preferably arranged to extend radially and/or circumferentially across at least part of the heat transfer plate 220. By controlling the gas pressure within each of the plurality of independently controllable gas volumes, and hence thermal conductivity, between the temperature controlled top plate 301 and the heater plate 304, or alternatively the heater plate 304 and the showerhead electrode 303, a prescribed radial temperature gradient can be established on the plasma exposed surface of the showerhead electrode 303. In one embodiment, the gas pressure within a particular independently controllable gas volume can be controlled within a range extending from about 0 torr to about 1 atm. Preferably, the gas pressure within a particular independently controllable gas volume is within a range extending from about 0 torr to 10 torr. In one embodiment, helium gas is supplied to the various gas volumes. However, in other embodiments, other types of gas or gas mixtures, e.g., nitrogen, can be supplied the various gas volumes.

FIG. 3A, B illustrate top views of embodiments of the heat transfer plate 220. The heat transfer plate comprises a plurality of independently controllable gas volumes defined to be fluidly isolated from others of the plurality of independently controllable gas volumes. The gas pressure within any given one of the plurality of independently controllable gas volumes does not affect another gas pressure within any other of the plurality of independently controllable gas volumes.

As shown in FIG. 3A, the heat transfer plate 220 can comprise sixteen radially extending independently controllable gas volumes. Eight of the gas volumes are located in an inner region 401 of the heat transfer plate 220 and the remaining eight gas volumes are located in an outer region 402 of the heat transfer plate. Each independently controllable gas volume extends about 38 to 45° around the circumference of the heat transfer plate 220.

Figure 3B:
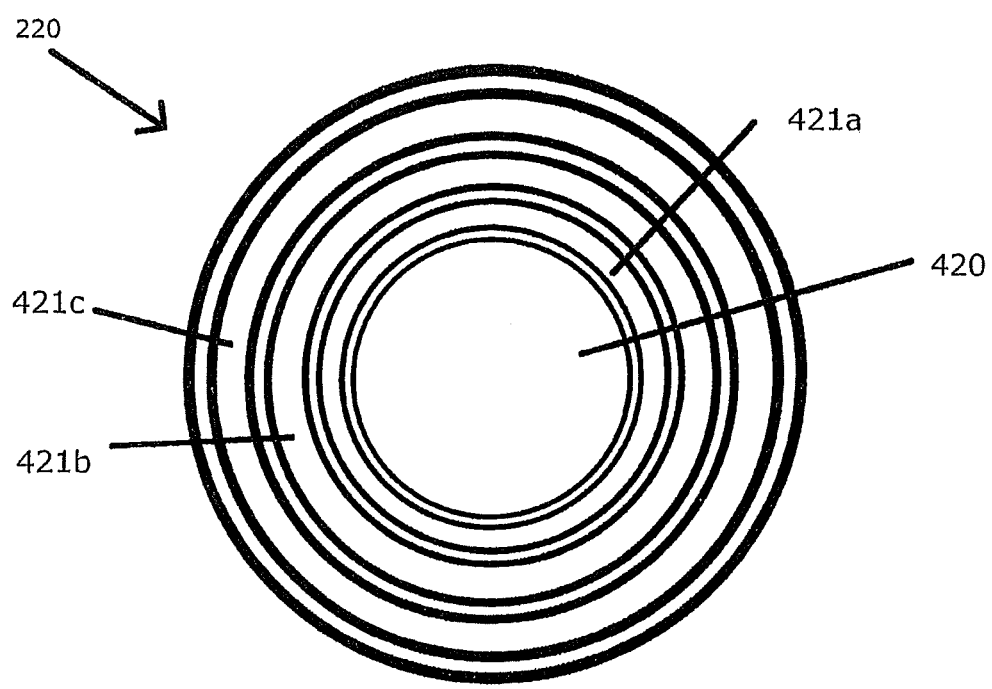

FIG. 3B illustrates the heat transfer plate 220 wherein the heat transfer plate 220 comprises a first cylindrical independently controllable gas volume 420 located at the center of the heat transfer plate 220 and three concentric annular independently controllable gas volumes 421a,b,c radially outward of the first cylindrical independently controllable gas volume. It will be apparent, however, to one skilled in the art that the heater transfer plate 220 may have more or less than three concentric annular independently controllable gas volumes.

Additionally, although the heat transfer plate 220 is described as having radially extending temperature control volumes (see FIG. 3A), it should be appreciated that in other embodiments the various independently controllable gas volumes within the heat transfer plate 220 can be defined to correspond to non-radial geometric configurations. For example, in other embodiments, the various gas volumes within the heat transfer plate 220 can be defined in a hexagonally divided configuration or in a quadrant divided configuration.

The heat transfer plate 220 can locally increase or decrease thermal conductance between the heater plate 304 and the temperature controlled top plate 301, or alternatively, the heater plate 304 and the showerhead electrode 303 in the showerhead electrode assembly. Greater control over thermal conductance in the showerhead electrode assembly allows more uniform temperatures to be attained across the plasma exposed surface of the showerhead electrode assembly in the plasma processing apparatus.

Referring back to FIG. 1, the semiconductor substrate 10 is processed in the capacitively coupled plasma processing apparatus 100. The method of processing comprises placing the semiconductor substrate 10 on a top surface 113 of the substrate support 11 inside the vacuum chamber 102. Next each independently controllable gas volume in the heat transfer plate 202 is pressurized to a predetermined pressure to attain a desired temperature profile across the plasma exposed surface 108 of the showerhead electrode assembly 104. Then measurements of the temperature across the plasma exposed surface 108 of the showerhead electrode assembly 104 are determined and the pressure in each independently controllable gas volume is adjusted in-situ to compensate for temperature gradients across the plasma exposed surface of the showerhead electrode. A process gas is then supplied into the vacuum chamber 102 from a gas supply, the process gas is energized into a plasma state, and the semiconductor substrate is etched with the plasma.

In alternate embodiments, the temperature gradient across the plasma exposed surface 108 is measured while etching, and in-situ adjustments of the pressure in each independently controllable gas volume is effectuated to increase uniformity of the etching by reducing temperature gradients along the plasma exposed surface 108 of the showerhead electrode assembly 104.

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode assembly of a plasma processing chamber, comprising:
   a showerhead electrode;
   a top plate configured to support the showerhead electrode;
   a heater plate disposed between the top plate and the showerhead electrode; and
   a heat transfer plate disposed between the showerhead electrode and the top plate, wherein the heat transfer plate comprises a plurality of independently controllable gas volumes such that a gas pressure within any given one of the plurality of independently controllable gas volumes does not affect another gas pressure within any other of the plurality of independently controllable gas volumes.

2. The showerhead electrode assembly of claim 1, wherein the heat transfer plate is disposed between the top plate and the heater plate.

3. The showerhead electrode assembly of claim 1, wherein the heat transfer plate is disposed between the heater plate and the showerhead electrode.

4. The showerhead electrode assembly of claim 1, wherein the independently controllable gas volumes have a radial configuration, a non-radial configuration, a hexagonally divided configuration, an octagonally divided configuration, or a quadrant divided configuration.

5. The showerhead electrode assembly of claim 1, wherein the heat transfer plate comprises sixteen radially extending independently controllable gas volumes wherein eight gas volumes are located in an inner region of the heat transfer plate and eight gas volumes are located in an outer region of the heat transfer plate, each independently controllable gas volume extending about 38 to 45° around the circumference of the heat transfer plate.

6. The showerhead electrode assembly of claim 1, wherein the heat transfer plate comprises a first cylindrical independently controllable gas volume and three concentric annular independently controllable gas volumes radially outward of the first cylindrical independently controllable gas volume.

7. The showerhead electrode assembly of claim 1, wherein a gas can be supplied to the independently controllable gas volumes of the heat transfer plate selected from helium, neon, argon, nitrogen, or a mixture thereof.

8. The showerhead electrode assembly of claim 1, further comprising at least one sensor, the at least one sensor configured to determine a temperature gradient across a plasma exposed surface of the showerhead electrode during use thereof.

9. The showerhead electrode assembly of claim 1, wherein each of the independently controllable gas volumes may be pressurized in a range of about 0 torr to about 1 atm.

10. The showerhead electrode assembly of claim 1, wherein each of the independently controllable gas volumes may be pressurized in a range of about 0 torr to about 10 torr.

11. A capacitively coupled plasma processing apparatus comprising:
    a vacuum chamber;
    a lower electrode assembly adapted to receive a semiconductor substrate;
    the showerhead electrode assembly of claim 1;
    at least one vacuum port in a bottom wall connected to at least one vacuum pump operable to maintain the vacuum chamber at a predetermined vacuum pressure;
    a gas source operable to supply process gas through the showerhead electrode assembly to the vacuum chamber; and
    an RF energy supply configured to energize the process gas into a plasma state.

12. The capacitively coupled plasma processing apparatus of claim 11, wherein the heat transfer plate is disposed between the top plate and the heater plate or the heat transfer plate is disposed between the heater plate and the showerhead electrode.

13. The capacitively coupled plasma processing apparatus of claim 11, wherein the independently controllable gas volumes of the heat transfer plate have a radial configuration, a non-radial configuration, a hexagonally divided configuration, an octagonally divided configuration, or a quadrant divided configuration.

14. The capacitively coupled plasma processing apparatus of claim 11, wherein the heat transfer plate comprises sixteen radially extending independently controllable gas volumes wherein eight gas volumes are located in an inner region of the heat transfer plate and eight gas volumes are located in an outer region of the heat transfer plate, each independently controllable gas volume extending about 38 to 45° around the circumference of the heat transfer plate.

15. The capacitively coupled plasma processing apparatus of claim 11, wherein the heat transfer plate comprises a first cylindrical independently controllable gas volume and three concentric annular independently controllable gas volumes radially outward of the first cylindrical independently controllable gas volume.

16. The capacitively coupled plasma processing apparatus of claim 11, wherein each of the independently controllable gas volumes may be pressurized in a range of about 0 torr to about 1 atm.

17. The capacitively coupled plasma processing apparatus of claim 11, wherein each of the independently controllable gas volumes may be pressurized in a range of about 0 torr to about 10 torr.

18. The capacitively coupled plasma processing apparatus of claim 11, further comprising at least one sensor, the at least one sensor configured to determine the temperature gradient across a plasma exposed surface of the showerhead electrode during use thereof.

19. A method of etching a semiconductor substrate in a capacitively coupled plasma processing apparatus using the capacitively coupled plasma processing apparatus of claim 11, comprising:
    placing a semiconductor substrate on a top surface of the lower electrode assembly inside the vacuum chamber;
    pressurizing each independently controllable gas volume in the heat transfer plate comprised in the showerhead electrode assembly to a predetermined pressure to effect a desired temperature profile across the plasma exposed surface of the showerhead electrode;
    measuring at least one temperature across the plasma exposed surface of the showerhead electrode;
    adjusting in-situ the pressure in each independently controllable gas volume to compensate for temperature gradients across the plasma exposed surface of the showerhead electrode;
    supplying a gas into the vacuum chamber from a gas supply; and
    energizing the gas into a plasma state and etching the semiconductor substrate with the plasma.

20. The method of claim 19, further comprising measuring the temperature gradient across the plasma exposed surface while etching, and adjusting in-situ the pressure in each independently controllable gas volume to effectuate more uniform etching by reducing temperature gradients along the plasma exposed surface of the showerhead electrode.

* * * * *